United States Patent
Cord et al.

(10) Patent No.: US 6,579,424 B2
(45) Date of Patent: Jun. 17, 2003

(54) METHOD FOR THE PRODUCTION OF SUBSTRATES, MAGNETRON SOURCE AND SPUTTER-COATING CHAMBER

(75) Inventors: Bernhard Cord, Alzenau (DE); Gerd Deppich, Aschaffenburg (DE); Karl-Heinz Schuller, Obertshausen (DE); Oliver Keitel, Seligenstadt (DE)

(73) Assignee: Unaxis Deutschland GmbH, Alzenau (DE)

( * ) Notice: Subject to any disclaimer, the term of this patent is extended or adjusted under 35 U.S.C. 154(b) by 0 days.

(21) Appl. No.: 09/775,527

(22) Filed: Feb. 1, 2001

(65) Prior Publication Data

US 2001/0022271 A1 Sep. 20, 2001

(30) Foreign Application Priority Data

Feb. 4, 2000 (DE) .......................... 100 04 824

(51) Int. Cl.⁷ .............................................. C23C 14/35
(52) U.S. Cl. ............................ 204/192.2; 204/192.12; 204/298.19; 204/298.2
(58) Field of Search .................. 204/192.12, 192.2, 204/298.17, 298.18, 298.19, 298.2

(56) References Cited

U.S. PATENT DOCUMENTS

| 4,872,964 | A |   | 10/1989 | Suzuki et al. ............... 204/298 |
| 4,927,513 | A | * | 5/1990  | Schultheiss et al. ... 204/192.13 |
| 5,248,402 | A | * | 9/1993  | Ballentine et al. ....... 204/298.2 |
| 5,252,194 | A |   | 10/1993 | Demaray et al. ......... 204/298.2 |
| 5,374,343 | A | * | 12/1994 | Sasaki et al. ............. 204/298.2 |
| 5,830,327 | A |   | 11/1998 | Kolenkow ............. 204/192.12 |
| 5,997,697 | A |   | 12/1999 | Gruenenfelder et al. ..................... 204/192.12 |

FOREIGN PATENT DOCUMENTS

| DE | 19508535 | 9/1996 |
| EP | 0439360  | 7/1991 |
| EP | 0211412  | 1/1994 |

OTHER PUBLICATIONS

"Mechanisms for Reactive DC Magnetron Sputtering of Elements . . . " by M. Kharrazi Olsson, et al, Elsevier Sciences S.A., 2000 —pp. 87–94.

* cited by examiner

Primary Examiner—Rodney G. McDonald
(74) Attorney, Agent, or Firm—Notaro & Michalos P.C.

(57) ABSTRACT

A target of an alloy of metals having different specific weights is used in a method for producing substrates that are coated with a layer comprising the same two metals by magnetron sputtering of the target. When sputtering such a target material, the metals of the alloy will sputter off with different sputtering characteristics with regard to a static angle $\alpha$ at which the sputtered off material leaves the target. For this reason, at the substrate to be sputter-coated, there occurs a demixing effect of these metals which will be deposited with a varying local ratio of the metals, that differs form the ratio of the metals in the alloy of the target. To counter-act this demixing phenomenon, the location of an electron trap formed by the magnetron field of the sputter source at the target with respect to the location of the substrate, is selected. By proving this electron trap and the resulting erosion profile on the target, the amount of deposited heavier metal to the amount of lighter metal is increased along the surface of the substrate.

11 Claims, 5 Drawing Sheets

METHOD FOR THE PRODUCTION OF SUBSTRATES, MAGNETRON SOURCE AND SPUTTER-COATING CHAMBER

FIELD AND BACKGROUND OF THE INVENTION

The present invention relates to a method for the production of substrates coated with a layer comprising at least two distinct heavy elements (L, S) by magnetron sputtering of a target made of a compound of the two elements.

The invention also relates to a method for generating an essentially centric erosion profile on a magnetron target and to a magnetron source.

The present invention also relates to a sputter-coating chamber with a magnetron source having a circular-disk or annularly shaped planar target as well as a substrate mounting for receiving an annularly or circular-disk shaped substrate that is coaxial with the target and spaced apart with respect to it, wherein the magnetron source generates at least one coaxial magnetron field revolving about the axis, as well as applications thereof.

The present invention builds on problems which are encountered when sputter-coating substrates for magnetic and/or magneto-optic storage disks, which are specifically planar and of annular shape. Therein also specifically circularly or annularly shaped targets are used, which in new condition are planar. The coating is carried out with an alloy; the targets comprise the coating alloy.

It was found that during sputtering or vapor deposition of alloy targets with different heavy metals, such as, for example, with Co and Pt, demixing takes place in the substrate plane. As a consequence an inhomogeneous distribution of the layer stoichiometry occurs as a function of the radius coordinate on the substrate. In the case of the magnetic or magneto-optic storage disks, this leads to inhomogeneous distribution of the coercivity.

SUMMARY OF THE INVENTION

An objective of the present invention is, first of all, to solve specifically this problem. However, therein far more generally the problem is solved of attaining on a substrate—which can well be of planar and annular or circular disk shape—when preparing a coating from a target, which comprises a compound of different heavy elements—and which primarily can well be of annular or circular-disk shape or planar, but does not need to be—on the coating a desired local distribution of the ratio of fraction of heavy and fraction of light elements. This is thus to be attained generally also for none circular-disk or annularly shaped substrates and/or nonplanar substrates or and in any combination for nonannularly or circular-disk shaped targets or nonplanar targets when in their new condition. Although metals are assumed to be involved, further, the problem of demixing generally for dissimilar heavy elements is to be solved.

Furthermore, the task formulation assumes primarily deposition of layers of target compound, thus in particular alloy layers. But since the cited demixing phenomenon can also have an undesirable effect in reactive processes, the invention also relates to reactive sputter-coating off targets of the considered compounds, in particular of alloy targets.

The issue here is, again specifically, to solve the described problems in the coating with layers which comprise the target alloy metals which, in terms of ratio of weights or specific densities, behave essentially like the metals Pt and Co, thus in particular for the deposition of layers with Pt and Co, or Tb, Fe and Co or Tb, respectively, Gd, Fe, Co.

The task posed according to the invention is generally solved in that the local distribution of the ratio (V) of the target alloy elements on the layer, through the selection of the mutual geometric disposition ($R_E$, $R_H$, r, d) of the electron trap forming the magnetron magnetic field and substrate, is at least approximated to a given local distribution of said ratio (V).

The basis of this part of the invention is the findings that heavy metals preferably and, with respect to the surface normal, are statistically released with a greater angle on a sputtering region than are lighter metals.

According to the present invention it is taken into consideration that the local distribution of the ratio of target alloy metals at the layer on the substrate, is at least approximated, by selecting the mutual geometric disposition of electron trap-forming magnetron magnetic fields and substrate, to a given local distribution of this ratio.

Specifically, measures are proposed of decreasing or increasing locally the cited ratio of heavy element, preferably metal, to light element on the substrate. According to another feature of the invention, a desired distribution is targeted, preferably with both cited measures, lowering and raising. Also and simultaneously, the layer thickness distribution on the substrate, due to the available degree of setting freedom, is also specifically adjusted, and, in particular, is homogenized.

Preferred embodiments of the method according to the invention are include defined in the dependant claims.

It was found that according to the invention it is highly desirable, in particular with said specific coatings of planar, circular-disk or annular-shaped substrates off, in new condition, planar, coaxial, circular-disk or annulus shaped targets, to provide a target erosion zone in the center of the target, wherewith for this preferred case the use of annularly shaped targets is omitted. The method according to another feature of the invention specifies the way in which fundamentally a center erosion zone is developed on a target.

According to still further features of the invention, a magnetron source according to the invention is specified, whose magnet configuration is laid out for the realization of a central erosion profile on the target.

The invention also includes specify sputter-coating chambers for circular-disk or annularly shaped coaxial targets which, in new condition, are planar, in which the geometric conditions are specified in order to attain a distribution of said ratio which, with respect to uniformity, is improved. Preferred embodiments of this sputter-coating chamber are specified in some of the dependent claims.

The present invention, under all of its aspects, namely production process, sputtering process, magnetron source and sputter-coating chamber, is suitable for the deposition of storage layers on magnetic or magneto-optic storage substrates or for the substrate coating with an alloy layer comprising at least PtCo, TbFeCo or GdFeCo.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following description, after the definition of terms employed and explanation of the phenomena recognized according to the invention, the measures taken according to the invention will be described in detail and the invention will be explained by example.

In the drawings.

DESCRIPTION OF THE PREFERRED EMBODIMENTS

The sputter emission characteristic of a given material is defined as the solid angle-dependent probability function which indicates the probability with which material sputtered in a sputter point is sputtered from the sputter surface into a spatial direction with respect to the sputter surface normal.

Figure 1:
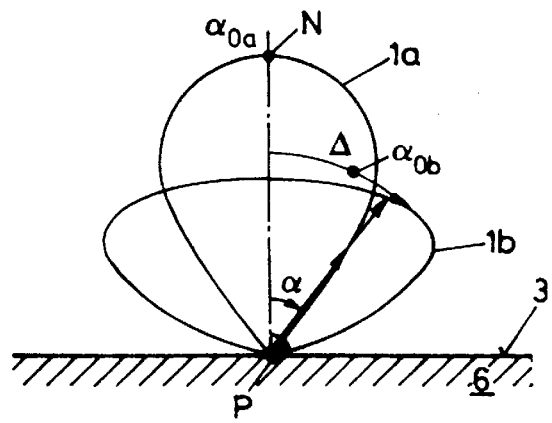
FIG. 1 is a schematic drawing qualitatively illustrating the sputter emission characteristics of distinct heavy metals for defining terms employed.

In FIG. 1 are shown purely qualitatively two material-specific emission characteristics $1a$ and $1b$, above a sputter point P on the sputter surface $3$ of a target $6$. It is therein customary to formulate the emission characteristics through a material-specific factor n in a $(\cos \alpha)^n$ function, with $\alpha$ as the angle to the surface normal N according to FIG. 1.

If, in the following, the emission angle $\alpha_0$ of a specific material from a point P according to FIG. 1, is referred to, that solid angle to the surface normal N is understood at which the considered material is sputtered off with greatest probability or frequency. If, as for example according to FIGS. 1, $1b$, the probability is essentially constant over an angular range $\Delta$, then $\alpha_0$ is defined as the center angle of $\Delta$.

The present invention fundamentally builds on the findings that heavier elements, thus also preferably metals, are sputtered off at a greater emission angle $\alpha_0$ than are lighter elements or metals. Looking back to FIG. 1, the characteristic $1b$ thus would correspond to that of a heavier element or metal S, the characteristic $1a$ to that of a lighter metal L.

In the following the element or metal ratio V will be introduced and defined by the fraction of the heavier element or metal $m_S$ to the fraction of the lighter one $m_L$ at a specific site.

The demixing problems described in the introduction lead to the undesirable local variation of the ratio V along the coated substrate surface.

Figure 2:
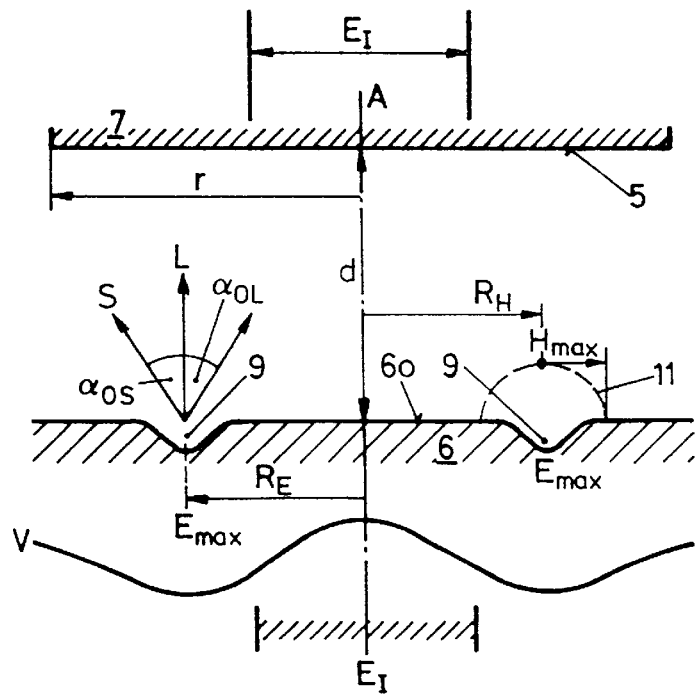
FIG. 2 schematically illustrates the conjunction between a configuration of substrate/magnetron sources or sputter-coating chamber of known type, and the development of inhomogeneous distribution of the metal ratio on the substrate.

For the purpose of heuristic explanation of the demixing effects, in FIG. 2 is schematically depicted the surface 5 of a planar circular-disk shaped substrate 7, coaxially in axis A to a circular-disk shaped planar target 6 of a magnetron source with a magnetron erosion zone 9, also coaxially encircling. The following geometric parameters will be introduced:

d: interfacial distance of substrate surface 5 to new target surface 6.

r: substrate radius $R_E$: radius of site of maximum erosion $E_{max}$ at erosion excavation 9

$R_H$: radius of site of maximum field strength H, parallel to the new target surface of the magnetron tunnel field 11 bringing about in known manner the erosion profile 9

$R_E$ and $R_H$ can be different even if only insignificantly. If, as in FIG. 2 and as is customary, $$R_E < r$$

or $$R_H < r,$$

applies,
a profile or a distribution of V on substrate 7 results, as is also plotted in FIG. 2 purely qualitatively. This fundamentally results from the fact that in substrate regions opposing the erosion profile 9 relatively more light element or metal L is deposited than the heavier element or metal S, compared to substrate zones which are offset radially inwardly or outwardly with respect to the erosion excavation 9 or generally of an erosion zone.

Based on this, it is evident according to the invention that fundamentally by defining or varying the relative geometric disposition of substrate 7 and erosion zones 9 on target 6, taking into consideration the element or metal specific density of different emission distributions or emission angle $\alpha_0$, the local distribution of the element or metal ratio V can be adjusted on the layer deposited along the substrate. Said relative geometric disposition can initially be understood if curved substrate surfaces and/or curved target surfaces as well as differently shaped substrates, such as circular-disk shaped, rectangular, elliptical etc. or likewise shaped target surfaces or erosion profiles realized thereon are considered.

In the present case of preferred interest, of circular-disk shaped substrates, further preferred planar, as well as in the coating by means of annular or circular-disk shaped targets disposed coaxially hereto, also planar in new condition, is evident said geometric relative disposition by presetting the parameters r, d, $R_E$ or $R_H$.

It must be emphasized, moreover, that the described demixing phenomena occur even if and exert an effect if, building on a target of an element compound or metal alloy of said type, layers are deposited through reactive sputtering on a substrate which is now no longer an alloy but rather comprises the elements or alloy metals of the target resulting from the reactive process. Therefore, in the present case, V is denoted as element or metal ratio and not as alloy ratio.

As described in the introduction, the present invention built on the need of sputter-coating circular-disk shaped, planar substrates, such as in particular for magnetic or magneto-optic storage applications, with an alloy layer, and specifically with a homogeneous distribution of V as well as also with uniform layer thickness distribution. In the following the procedure according to the invention to solve this task is explained, wherein it is readily possible for a relevant person skilled in the art to form correspondingly the described procedure for reactive processes or for the coating of different types of substrates and/or from different types of magnetron targets.

Figure 3:
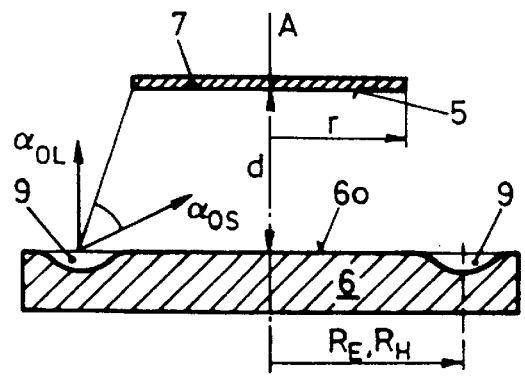
FIG. 3 is a representation analogous to that of FIG. 2 but showing a first measure according to the invention with respect to the geometric disposition of erosion on the target and substrate surface to be coated.

The same reference symbols have been used in FIG. 3 for the positions already denoted in conjunction with FIG. 2. Compared to FIG. 2, in the configuration according to the invention after FIG. 3 the target erosion zones or the encircling erosion excavation 9 is offset radially outwardly with respect to axis A with respect to the margin region of substrate 7. It is found $$R_E > r \text{ or } R_H > r \quad (1)$$

therein in particular $$R_E \geq 1.2r \text{ or } R_H \geq 1.2r.$$

Thereby, in view of FIG. 2, according to the invention a region $E_I$ is utilized for the substrate coating at constant examined $R_E$ or $R_H$ and d.

Through the outward offset of the magnetron erosion zones 9 with respect to a substrate margin region, fundamentally the ratio V at the substrate coating is raised in this margin region: the fraction increases of the deposited heavy element or metal S with respect to the deposited fraction of light element or metal L.

Figure 4:
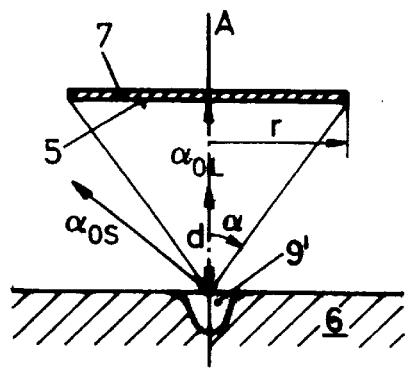
FIG. 4 is a representation analogous to FIGS. 2 or 3 but showing a further measure according to the invention for influencing said ratio distribution.

In FIG. 4 in a representation analogous to FIGS. 2 and 3 a further measure is depicted which, by itself, is a measure according to the invention. Accordingly, the target 6 is eroded in its central region, as is shown with the erosion profile 9'. As a function of angle α with respect to axis A the ratio V is lowered toward the substrate center, thus with decreasing substrate radius r, thereby that increasingly less heavy element or metal S is deposited.

Thus, in particular, two measures according to FIG. 3 and 4 are available. If they are combined, as is especially preferred according to the invention, by proceeding according to FIG. 3 toward the margin region of substrate 7 results an increasing of the ratio V and by proceeding according to FIG. 4 toward its center results a decreasing of this ratio V. Furthermore, through this combination results a homogenization of the layer thickness distribution on the substrate.

But proceeding according to FIG. 4 requires providing a target without center hole and realizing an electron trap in the region of the target center with the aid of a magnetron magnetic field laid out for this purpose, which is quite unusual. It will be necessary to return to this point.

For planar, circular-disk shaped substrates and like targets coaxial hereto, for a homogenization of ratio V—in particular for elements, therein in particular metals whose specific density behaves at least approximately like that of Co and Pt—in particular for the coating with a CoPt or a TbFeCo alloy, in particular for magnetic or magneto-optic storage applications, the following dimensioning is recommended:

$$1.2r \leq R_E \leq 5r,$$

preferably $$1.2r \leq R_E \leq 2r,$$

or $$1.2r \leq R_H \leq 5r \quad (1a)$$

preferably $$1.2r \leq R_H \leq 2r$$

or $$r/2 \leq d \leq 3r$$

preferably $$r/2 \leq d \leq 2r.$$

Figure 5:
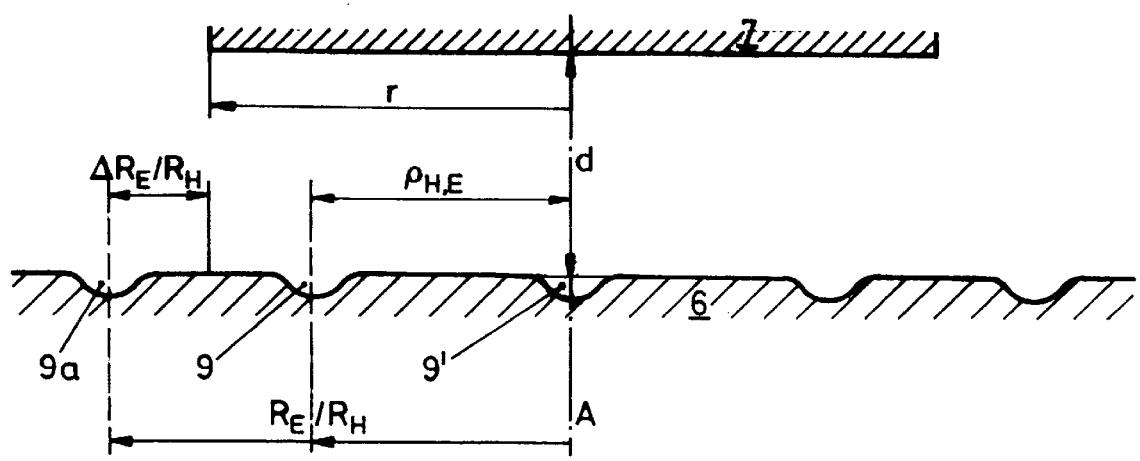
FIG. 5 is a representation analogous to FIGS. 2 to 4, which shows the combination of the measures according to the invention according to FIGS. 3 and 4, realized for the coating of a more extensive substrate.

The embodiment according to FIG. 3 and an embodiment combined according to FIG. 3 and FIG. 4 yields first of all a configuration in which either a single erosion excavation 9 or an erosion excavation and a central erosion profile 9' become active. But, if more extensive substrates are to be coated, then the necessity, if appropriate, may arise—in particular also due to the requirement for a homogeneous layer thickness distribution—to provide more than one encircling erosion excavation 9 on the target, if necessary, additionally with a central erosion profile 9'. Such a procedure is shown in FIG. 5 again schematically. Based on this it is, in particular, evident that with respect to the disposition of the radially outermost erosion excavation 9a the radii ratios no longer, as considered up to now, on the one hand, of substrate 7, r and of the erosion excavation maximum $R_E$ or of the magnetic field maximum $R_H$ are essential, but rather, due to the emission angle relevance the ratio of the overhang $\Delta R_E$ or $\Delta R_E$ over the periphery of substrate 7, referred to the substrate/new target surfaces distance d. Consequently, $$\Delta R_E = R_E - r \text{ respectively}$$

$$\Delta R_H = R_H - r$$

applies.

In this case the following dimensioning is recommended:

$$0.33d \leq \Delta R_E \leq 4d$$

preferably $$0.33d \leq \Delta R_E \leq 2d$$

$$0.33d \leq \Delta R_H \leq 4d \quad (1b)$$

preferably $$0.33d \leq \Delta R_H \leq 2d.$$

These conditions result based on the previously discussed (1a).

Moreover, in particular with view onto the maximally homogeneous layer thickness distribution to be attained, it is recommended to select the distance $\Delta\rho_H$ and $\Delta\rho_E$ of erosion maxima respectively maximal new target surface-parallel tunnel field components, if feasible, to be no greater than $$\Delta\rho_E \leq 2d$$

respectively $$\Delta\rho_H \leq 2d \quad (2a)$$

wherein already a good layer thickness distribution respectively homogeneity results when maintaining $$d = \leq \Delta\rho_E, \text{ respectively}$$

$$d = \leq \Delta\rho_H,$$

which consequently leads to a preferably recommended range of:

$$d \leq \Delta\rho_E \leq 2d, \text{ respectively}$$

$$d \leq \Delta\rho_H \leq 2d. \quad (2b)$$

Furthermore shall apply:

$$2r > \Delta\rho_E > r$$

respectively $$2r > \Delta\rho_H > r.$$

Figure 6:
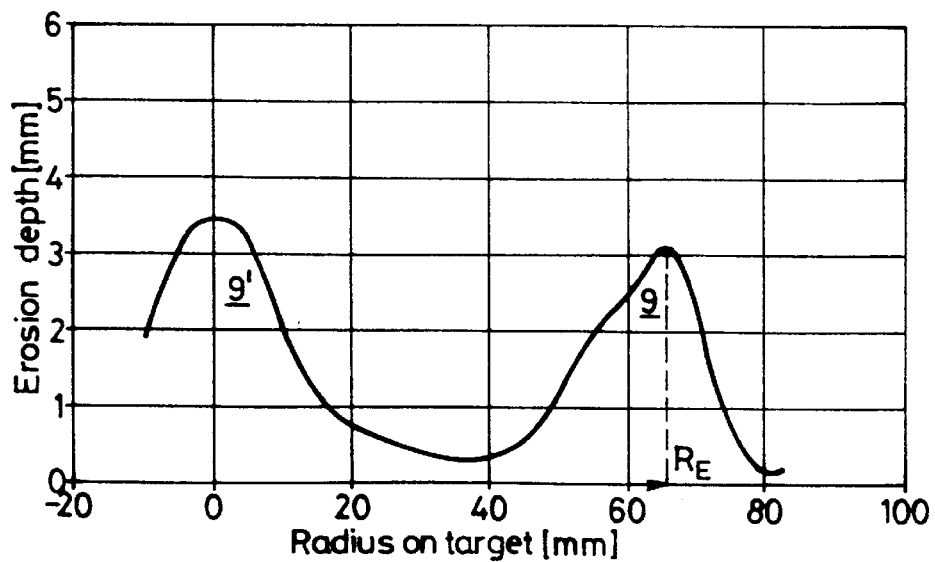
FIG. 6 is a graph plotting a sputter erosion profile realized according to the invention on a Co/Pt target with the combination of the measures according to FIG. 3 and 4.

With the combination of the procedures according to FIGS. 3 and 4 and with the following dimensioning:

$R_E \cong 65$ mm center erosion profile 9' r=47.5 mm d=42 mm when sputter coating the substrate with a CoPt alloy with a yet to be described magnetron configuration the erosion profile on the target depicted in FIG. 6 was obtained, from which the encircling erosion excavation 9 as well as also the bell-shaped central erosion profile 9' are clearly recognizable. The V distribution on the target was constant.

Figure 7:
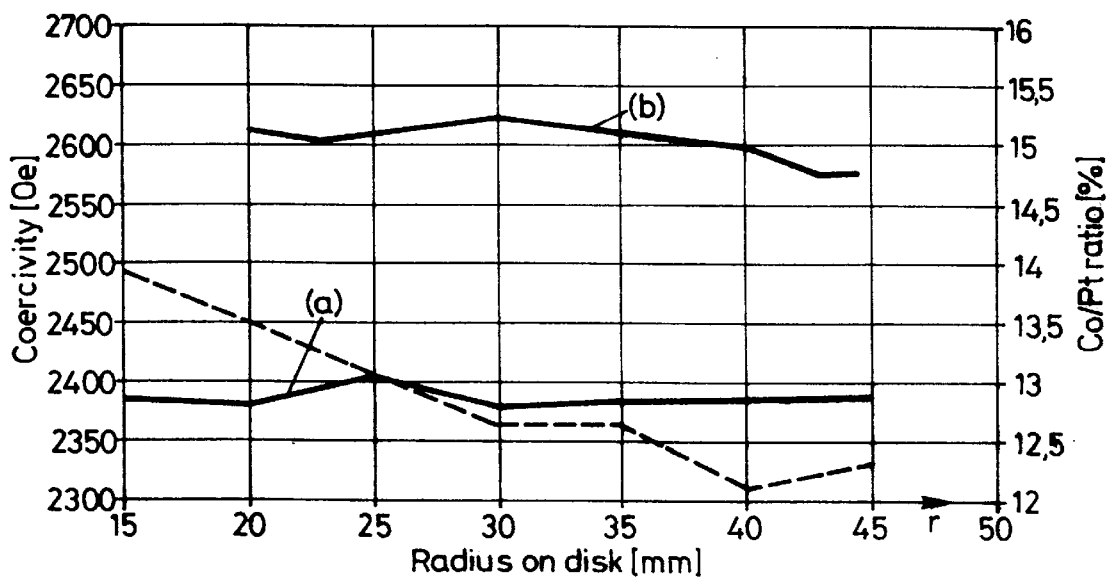
FIG. 7 is a graph plotting the profile resulting from the metal distribution Co/Pt at (a) and, in dashed line, the resulting distribution profile without use of the measures according to the invention after FIG. 3 and 4 as well as at (b), the resulting distribution of the coercivity when proceeding according to the invention.

Further, the V profile (a) depicted in FIG. 7 resulted. In FIG. 7 is plotted furthermore in dashed lines the V profile over the substrate radius r, which results if no central erosion profile 9' according to FIG. 4 is realized on the identical configuration. Based thereon, it is readily apparent, on the one hand, the surprisingly large effect of the process according to the invention after FIG. 4 as well as, in view of FIG. 2, the significance for the coating of the substrate 7, of utilizing the range with r<$R_E$ respectively r<$R_H$.

Figure 8:
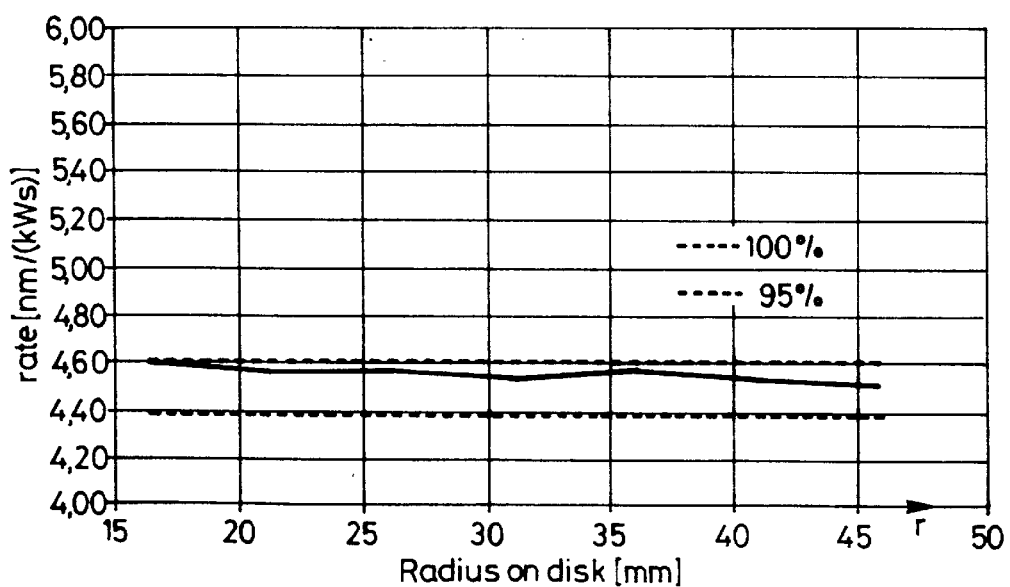
FIG. 8 is a graph plotting the resulting coating rate distribution over the substrate radius.

The resulting coating rate distribution is shown in FIG. 8.

Figure 9:
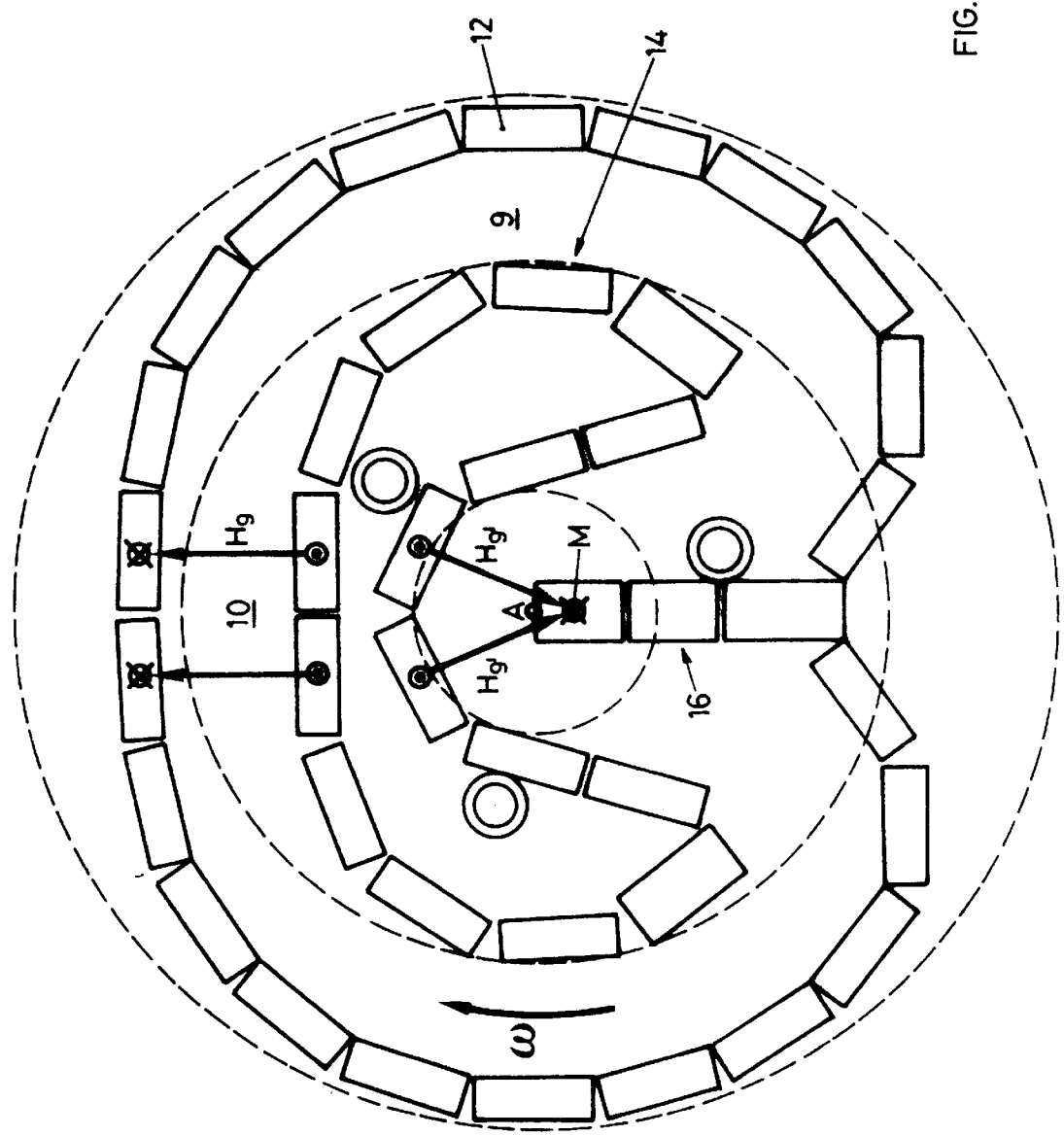
FIG. 9 is a top view of the magnet configuration on a magnetron source according to the invention in a preferred embodiment for realizing encircling erosion excavations on the target as well as also a central erosion profile in a coating chamber according to the invention.

As stated it is not customary to form an electron trap in the target center with magnetron sources. In FIG. 9 is shown in top view a magnet configuration according to the invention of the magnetron source according to the invention. It comprises on a support plate 10 an outer magnet collar 12 as well as an inner one 14. The outer magnet collar 12 is polarized in the direction of axis A in one direction, while the inner magnet collar 14 in this respect is polarized in the opposite direction as is indicated in FIG. 8. In top view, according to FIG. 8 the tunnel-form magnetic fields $H_9$ result extending over the target which is augmented through the effect of the support plate 10 of a magnetizable material as a magnetic shortcircuit.

For realizing an electron trap in the center of the target for producing the erosion profile 9' also indicated in FIG. 6, the inner magnet collar 14, which per se extends around axis A, is indented in the form of a kidney such that axis A comes to lie outside of the surface encompassed by magnet collar 14. The outer magnet collar 12, in turn, comprises a spoke 16 extending inwardly up into the region of axis A. The resulting magnetic field $H_9'$ in the center region is also plotted.

If, further, it is taken into consideration that the magnet configuration depicted in FIG. 8 and preferably realized with permanent magnets as shown with ω, extends driven about axis A under the stationary target, it is evident that, on the one hand, between the regions essentially encircling coaxially of the two magnet collar 12 and 14 the electron trap tunnel field producing the erosion excavation 9 is generated, and, at the region indented in the form of a kidney of the inner magnet collar 14 and the spoke 16 of the outer one, generates a central field which produces a central erosion profile 9' essentially in the form of a bell.

Figure 10:
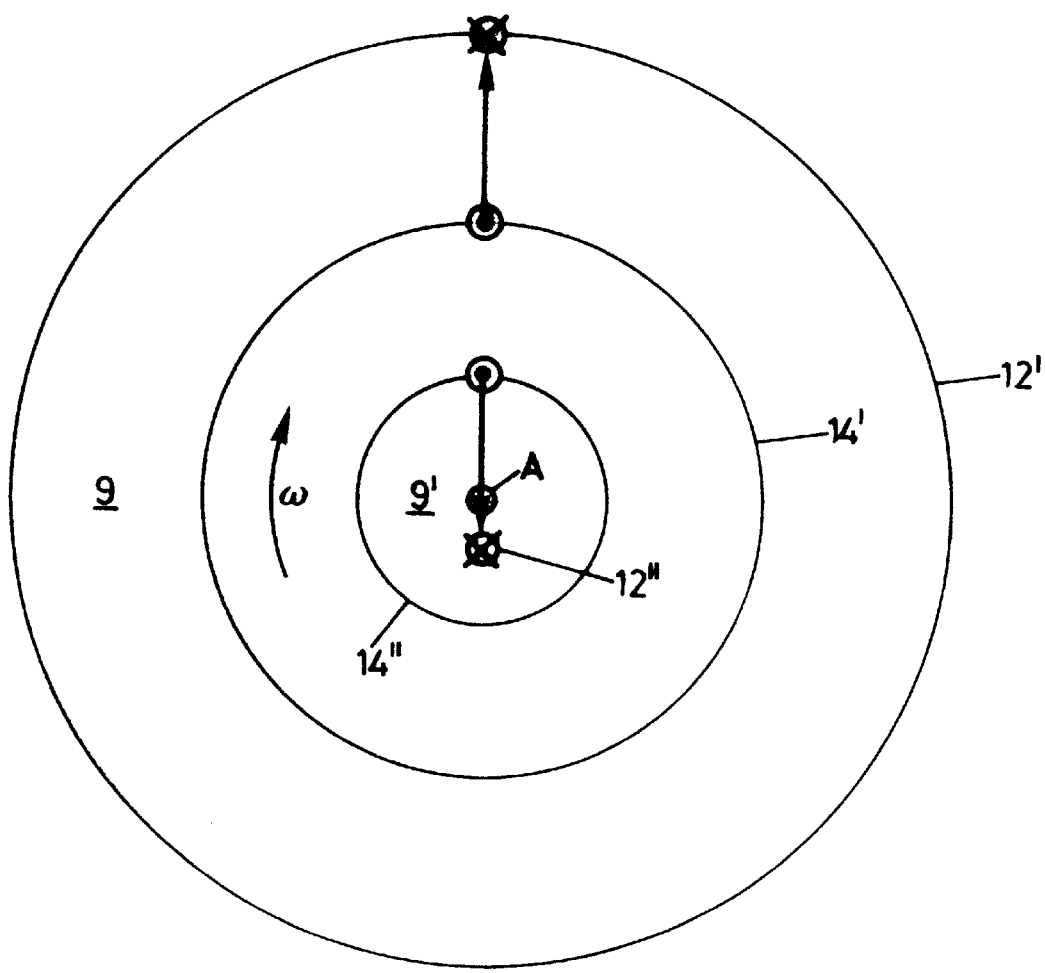
FIG. 10 is a schematic representation of a further embodiment of the invention of a magnet configuration according to FIG. 9.

It should be noted that thereby that the spoke 16 is not carried beyond axis A, the innermost magnet pole, denoted by M in FIG. 9, of the spoke revolved about axis A slightly eccentric with respect to axis A, which advantageously leads to the fact that the center of the target is also decisively eroded. As shown schematically in FIG. 10, it is entirely possible to realize the magnetic field for the erosion excavation 9 according to the invention with a first and second magnet collar 12' and 14', and through a magnet collar 14" and a central magnet configuration 12" the magnetron field for producing the central erosion profile 9'. The central magnet 12" in this case is also disposed slightly eccentrically with respect to axis A.

With the process according to the invention, i.e. the method according to the invention and/or the use of a magnetron source according to the invention, respectively with the magnetron sputter chamber according to the invention, it becomes possible to coat a substrate from a target comprised of an alloy of two or more dissimilarly heavy metals such that the surface distribution of the deposited alloy metals follows a desired distribution, in particular is constant, in reactive processes as well as also in particular in nonreactive processes, in which a metal alloy layer is deposited. This is especially advantageous in the fabrication of magnetic or magneto-optic storage disks in which the coercivity of the deposited alloy layers varies as a function of the alloy composition V.

While specific embodiments of the invention have been shown and described in detail to illustrate the application of the principles of the invention, it will be understood that the invention may be embodied otherwise without departing from such principles.

What is claimed is:

1. A method for manufacturing an annular or circular planar substrate with an outer radius and coated with a layer of a material which comprises at least two elements of different weight and having a substantially constant thickness and a substantially constant distribution of a ratio of an amount of heavier weight element to an amount of lighter weight element in said material along a surface of said substrate, the method comprising the steps of:

magnetron sputtering a material with said at least two elements from a target surface thereby generating in said target surface at least one erosion excavation with a maximum depth along a substantially circular locus about a center of said target surface and having an excavation radius and further generating a second erosion excavation in said center;

placing said substrate with a surface to be coated at a distance from, opposite to and substantially parallel to said target surface and centered about said center;

selecting said excavation radius of said at least one erosion excavation to be larger than said outer radius of said substrate; and coating said surface of said substrate with said layer comprising said material.

2. The method of claim 1, wherein said at least two elements are metals.

3. The method of claim 1, wherein said material of said layer of material is a metal alloy.

4. The method of claim 1, further comprising the step of generating more than one said erosion excavation with a maximum depth along a substantially circular locus about said center.

5. The method of claim 1, including the step of selecting said excavation radius ($R_E$) with respect to said outer radius (r) to fulfil $$1.2r \leq (R_E) \leq 5r.$$

6. The method of claim 1, further comprising the step of placing said substrate at a distance d from said target surface in non-sputtered condition, and selecting said distance d with respect to said outer radius r to fulfil $$r/2 \leq d \leq 3r.$$

7. The method of claim 1, further comprising the step of placing said substrate at a distance d from the target surface in a new condition and selecting said excavation radius to be larger than said outer radius by $\Delta R_E$ thereby applying $$0.33d \leq \Delta R_E.$$

8. The method of claim 1, further comprising the step of generating at least two of said erosion excavation with a maximum depth along a substantially circular locus about said center of said target surface having a radius each the difference of radius of subsequent of said loci being $\Delta \rho_E$ and further placing said substrate at a distance d from said target surface in its new condition and selecting $$\Delta \rho_E \leq 2d.$$

9. The method of claim 1, further comprising the step of generating said erosion excavation in said center by applying a tunnel-shaped magnetic field with magnetic field lines exiting and penetrating respectively from and into said target surface on both sides of said center and eccentrically thereto and further rotating said magnetic field along said target surface about said center.

10. The method of claim 1, further comprising applying beneath said target surface an arrangement of magnets, said arrangement comprising a first loop of magnets surrounding central axis perpendicularly to said sputtering surface and through said center and a second loop of magnets, said second loop being kidney-shaped and not surrounding said axis and further magnets disposed from said first loop radially toward said axis outside said second loop and relatively rotating said arrangement of magnets about said axis with respect to said target surface.

11. The method of claim 1, wherein said at least two elements are selected from Pt, Tb, Fe, Gd, Co.

* * * * *